US006757049B2

(12) United States Patent
Minami

(10) Patent No.: US 6,757,049 B2
(45) Date of Patent: Jun. 29, 2004

(54) APPARATUS AND METHOD FOR EXPOSURE

(75) Inventor: Akiyuki Minami, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 17 days.

(21) Appl. No.: 10/259,606

(22) Filed: Sep. 30, 2002

(65) Prior Publication Data

US 2003/0081189 A1 May 1, 2003

(30) Foreign Application Priority Data

Oct. 26, 2001 (JP) ........................................ 2001-329122

(51) Int. Cl.⁷ .......................... G03B 27/68; G03B 27/58
(52) U.S. Cl. .............................. 355/52; 355/55; 355/72
(58) Field of Search ............................. 355/52, 53, 55, 355/72, 75; 356/399, 400, 401

(56) References Cited

U.S. PATENT DOCUMENTS

| 5,142,156 | A | * | 8/1992 | Ozawa et al. ................ 250/548 |
| 6,018,395 | A | * | 1/2000 | Mori et al. .................. 356/401 |
| 6,279,881 | B1 | * | 8/2001 | Nishi .......................... 250/548 |
| 2002/0021428 | A1 | * | 2/2002 | Nakano et al. ............... 355/53 |

* cited by examiner

*Primary Examiner*—Rodney Fuller
(74) *Attorney, Agent, or Firm*—Rabin & Berdo, PC

(57) ABSTRACT

In order to reduce a displacement in position between an under pattern and a resist pattern due to distortion, a reticle (18) formed with reticle alignment marks (32) at at least two points is used, reticle microscopes (34) are respectively placed in association with positions of the reticle alignment marks (32) at the time that the reticle (18) is supported by a reticle stage (20) and rotated about an optical axis (Z axis) of an image-forming optical system (26) by 90°, and the reticle alignment marks (32) are detected by any reticle microscope (34) even if the reticle (18) being supported by the reticle stage (20) is rotated about the Z axis.

6 Claims, 6 Drawing Sheets

ROTATION OF 90°

APPARATUS AND METHOD FOR EXPOSURE

BACKGROUND OF THE INVENTION

1. Field of the Invention

The present invention relates to an apparatus and a method for exposure, and particularly to an apparatus and a method for exposure, which are used in a photolithography process step in a manufacturing process of a semiconductor integrated circuit.

2. Description of the Related Art

In a manufacturing process of a semiconductor integrated circuit (LSI) up to now, a photolithography step for forming resist patterns used as transferred images for integrated circuit patterns on a semiconductor integrated circuit substrate (hereinafter called a "wafer"), and an etching step for allowing the resist patterns formed in the photolithography step to function as block or stop parts and removing unnecessary portions from an under or bed film are repeatedly performed to thereby form a three-dimensional structure of LSI on the wafer.

In the photolithography step, more specifically, a photosensitive polymer film (hereinafter called a "resist film") is applied onto the wafer and thereafter exposure light such as ultraviolet light is applied to a photomask (hereinafter called a "reticle") formed with integrated circuit patterns by chromium or the like having a property lightproof against the exposure light on a glass substrate, and light reflected by or transmitted through an equi-magnification or reduction optical system is focused on the surface of the wafer to form images by the equi-magnification optical system, followed by exposure, thereby transferring the resultant integrated circuit patterns onto the wafer surface. This is repeatedly performed while the wafer is being moved in an X-axis direction and a Y-axis direction to expose the whole surface of the wafer, followed by execution of alkaline development, whereby resist patterns used as transferred images for the integrated circuit patterns are formed on the wafer.

While many photolithography steps are executed till the fabrication of LSI, each of the photolithography steps needs to make alignment with a resist pattern (hereinafter called an "under or bed pattern") formed in a photolithography step executed prior to the above steps with high accuracy to thereby form the resist patterns. Therefore, an exposure apparatus used in the photolithography step is provided with a mechanism for accurately detecting the positions of the wafer and reticle.

Described specifically, the wafer has an outer peripheral portion formed with a cut-away portion and a surface formed with a plurality of alignment marks for the purpose of the above alignment in general. The exposure apparatus first detects the cut-away portion provided at the outer peripheral portion and makes rough alignment in a rotational direction, followed by transfer of the wafer to a wafer stage. Next, the exposure apparatus detects the separated alignment marks at at least two points by means of microscopes to enhance position accuracy in the rotational direction and subsequently detects the alignment marks at about ten points, thereby detecting the accurate position of the wafer. On the other hand, since the reticle is not affected by severe thermal stress, film stress, etc. resulting from a manufacturing process of LSI as distinct from the wafer, position detection can be performed with satisfactory accuracy under the less number of alignment marks to be measured. In the exposure apparatus, the reticle is held by a reticle stage, and alignment marks formed respectively at one pair of opposed sides of the reticle surface, i.e., two alignment marks formed symmetrically about the optical axis of the exposure apparatus are detected, thereby detecting the accurate position of the reticle. The exposure apparatus brings the wafer and reticle into registration with high accuracy by undergoing such an alignment sequence.

Meanwhile, distortion caused by aberration of a lens exists in the exposure apparatus as a factor that inhibits high-accuracy alignment. The term distortion means such an influence that when a pattern for the reticle is image-formed on the wafer surface through an image-forming optical system, the form thereof is distorted and hence a displacement is developed in the position of each image point of a transferred image.

In order to explain the influence of the distortion specifically, a transferred image 100 for an actual reticle pattern formed on a wafer surface by image-forming, and a transferred image 102 for an ideal reticle pattern are shown in FIG. 6. Since the actual transferred image 100 is distorted in form due to the influence of the distortion as shown in FIG. 6, it dose not coincide with the ideal transferred image 102. Incidentally, FIG. 6 emphatically shows distortion to explain the influence of the distortion. While only the contour of the transferred image is shown, distortion actually occurs even thereinside.

While the lens per se is designed so as not to cause such a displacement in position as a matter of course, distortion occurs due to a process error produced upon lens manufacture, an error produced upon mounting thereof to a main body of the exposure apparatus, etc. Thus, a tendency to distortion and the extent (hereinafter called "form of distortion") thereof vary every exposure apparatuses. If a photolithography process is performed under the same exposure apparatus, then substantially the same distortion forms are reached every times, thus causing no large problem in terms of the alignment of the under pattern with the resist pattern formed thereon.

However, many photolithography steps executed in the LSI manufacturing process do not necessarily use the same exposure apparatus every time from the viewpoint of productivity. When exposure apparatuses different in distortion form are utilized in combination, a large position displacement occurs between the under pattern and the resist pattern formed thereon, thus causing problems such as degradation in device characteristic of LSI, yield degradation, etc. When, for example, an exposure apparatus for forming such a transferred image 50 as shown in FIG. 7(A) on a wafer and an exposure apparatus for forming such a transferred image 52 on a wafer as shown in FIG. 7(B) are utilized in combination, position displacements occur between the transferred images formed on the wafer by the respective exposure apparatuses as shown in FIG. 7(C). Incidentally, ideal transferred images are shown by dotted lines in FIGS. 7(A) and 7(B).

SUMMARY OF THE INVENTION

The present invention has been made to solve the above problems. It is an object of the present invention to provide an apparatus, which are capable of reducing a displacement in position between an under pattern and a resist pattern due to distortion.

In order to achieve the above object, there is provided an exposure apparatus, comprising reticle support means for supporting a reticle on a predetermined position, wafer support means for supporting a wafer on a predetermined position, a light source for applying exposure light to the reticle, and an image-forming optical system for focusing the light of reflected by or transmitted through the reticle, of the exposure light irradiated from the light source onto the surface of the wafer supported by the wafer support means to thereby form each image, wherein the reticle supported by the reticle support means and the wafer supported by the wafer support means, and the image-forming optical system are rotatably provided relatively about an optical axis of the image-forming optical system.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 3 is a transfer image conceptual diagram, wherein

DETAILED DESCRIPTION OF THE PREFERRED EMBODIMENTS

Preferred embodiments of the present invention will hereinafter be described in detail with reference to the accompanying drawings.

<First Embodiment>

Figure 1:
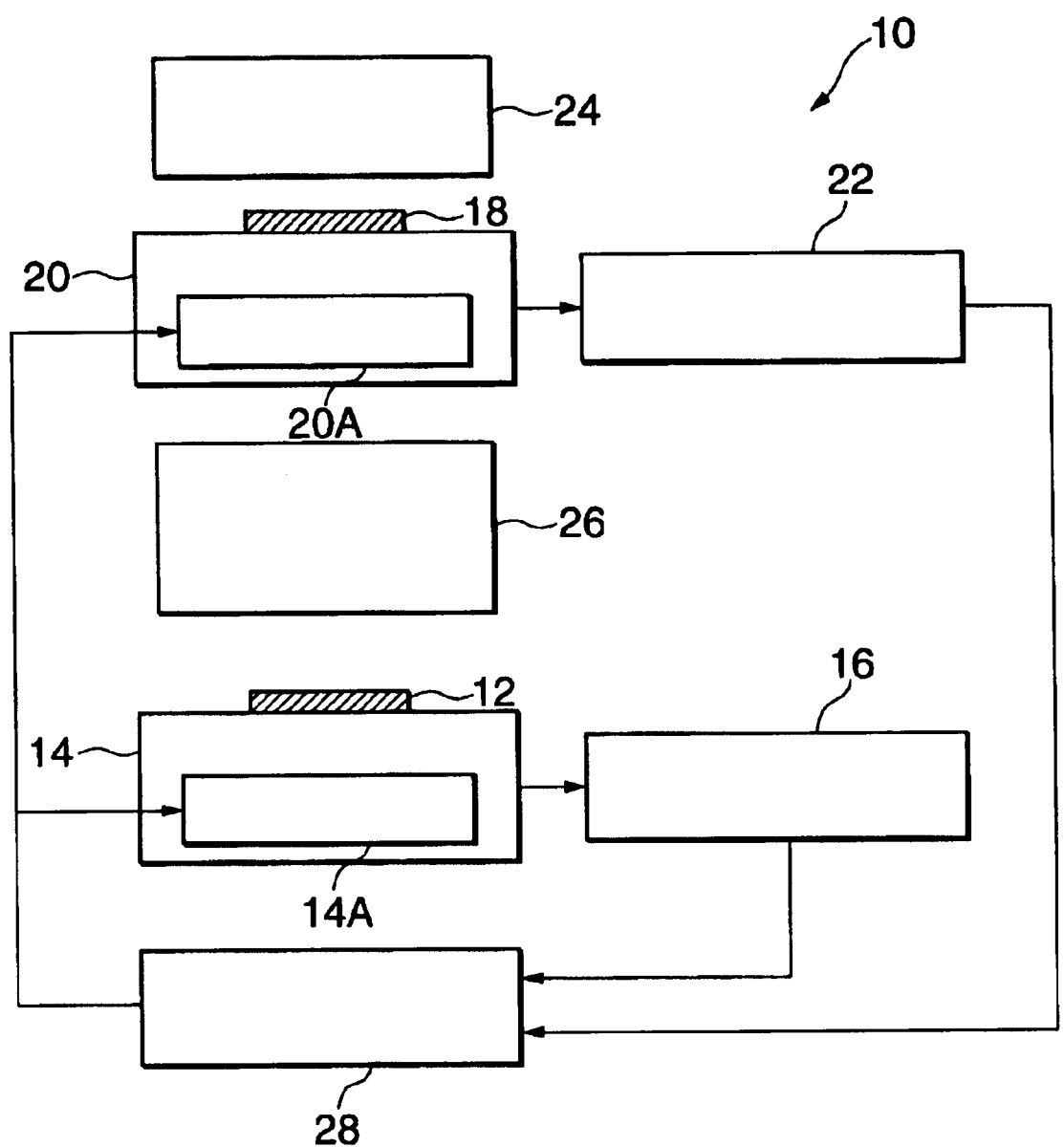
FIG. 1 is a schematic block diagram showing an exposure apparatus according to a first embodiment of the present invention.

FIG. 1 is a schematic block diagram of an exposure apparatus to which the present invention is applied. As shown in FIG. 1, the exposure apparatus 10 comprises a wafer stage 14 provided as wafer support means for supporting a wafer 12 coated with a resist film in advance, a wafer position detector 16 for detecting the position of the wafer 12 supported on the wafer stage 14, a reticle stage 20 provided as reticle support means for supporting a reticle 18 formed with integrated circuit patterns, a reticle position detector 22 for detecting the position of the reticle 18 supported on the reticle stage 20, a light source 24 for applying exposure light to the reticle supported on the reticle stage 20, an image-forming optical system 26 for focusing light transmitted through the reticle on the surface of the wafer 12 located on the wafer stage 14 to form each image, and a stage controller 28 for controlling the positions of support of the wafer and reticle by the wafer stage 14 and reticle stage 20.

While the present embodiment is described with a so-called projection type exposure apparatus for allowing the image forming optical system 26 to focus the light transmitted through the reticle on the wafer surface to thereby form each image as the illustrated example, it may be a reflection type.

The respective members will be described below in detail.

The wafer stage 14 is provided with the conventionally-known position adjuster 14A for moving a support surface thereof for supporting the wafer 12 in parallel along the direction (hereinafter called Z axis) of an optical axis of the image-forming optical system and X and Y axes for defining a plane surface orthogonal to the Z axis, and rotating it about the respective axes (the respective axial directions: see FIG. 2).

In the wafer stage 14, the position adjuster 14A moves the support surface in parallel along the Z axis to thereby move the surface of the wafer 12 being supported on the wafer stage 14 toward or away from the image-forming optical system 26, thereby making it possible to adjust a focus position. Further, the position adjuster 14A rotates the support surface about the X and Y axes to thereby hold the surface of the wafer horizontally (in the direction orthogonal to the Z axis), moves the surface of the wafer in parallel in the X- and Y-axes directions, and rotates the surface of the wafer about the Z axis to thereby make it possible to position the wafer 12. Further, the support surface may be parallel-moved along the X- and Y-axes directions every exposure shots so as to move an exposure position on the surface of the wafer 12. Incidentally, the driving of the position adjuster 14A of the wafer stage 14 is controlled by the stage controller 28.

An imaging device such as a CCD camera can be used in the wafer position detector 16 and is placed in a position capable of effecting imaging over the wafer stage 14. The result of imaging or photography is inputted to the stage controller 28 via an A/D converter (not shown) and used to perform control on the position adjuster 14A by the stage controller 28.

Described in detail, the stage controller 28 makes use of data about a result imaged when the wafer stage 14 is supporting the wafer 12 conveyed onto the wafer stage 14, to effect image processing on the data about the result of imaging, for example, thereby detecting an alignment mark formed on the wafer 12 to detect (grasp) the position of the wafer. The controller 28 controls the driving of the position adjuster 14A of the wafer stage 14 based on the result of detection of the alignment mark in such a way that the alignment mark coincides with a predetermined reference position, thereby performing precise position alignment of the wafer.

Incidentally, the wafer 12 is to be conveyed to the wafer stage 14 after an unillustrated pre-alignment device detects a cut-away portion 30 (see FIG. 2) provided on the outer periphery of the wafer 12 through the use of a CCD camera, a laser beam positioning device or the like to thereby carry out rough alignment.

The reticle stage 20 has a conventionally-known position adjuster 20A for moving the support surface for supporting the reticle 18 thereon along the X and Y axes and rotating it about the Z axis. In the reticle stage 20, the position adjuster 20A moves the support surface in parallel along the X and Y axes and rotates it about the Z axis to thereby make it possible to position the reticle 18. Incidentally, the driving of the position adjuster 20 of the reticle stage 20 is controlled by the stage controller 28.

Figure 2:
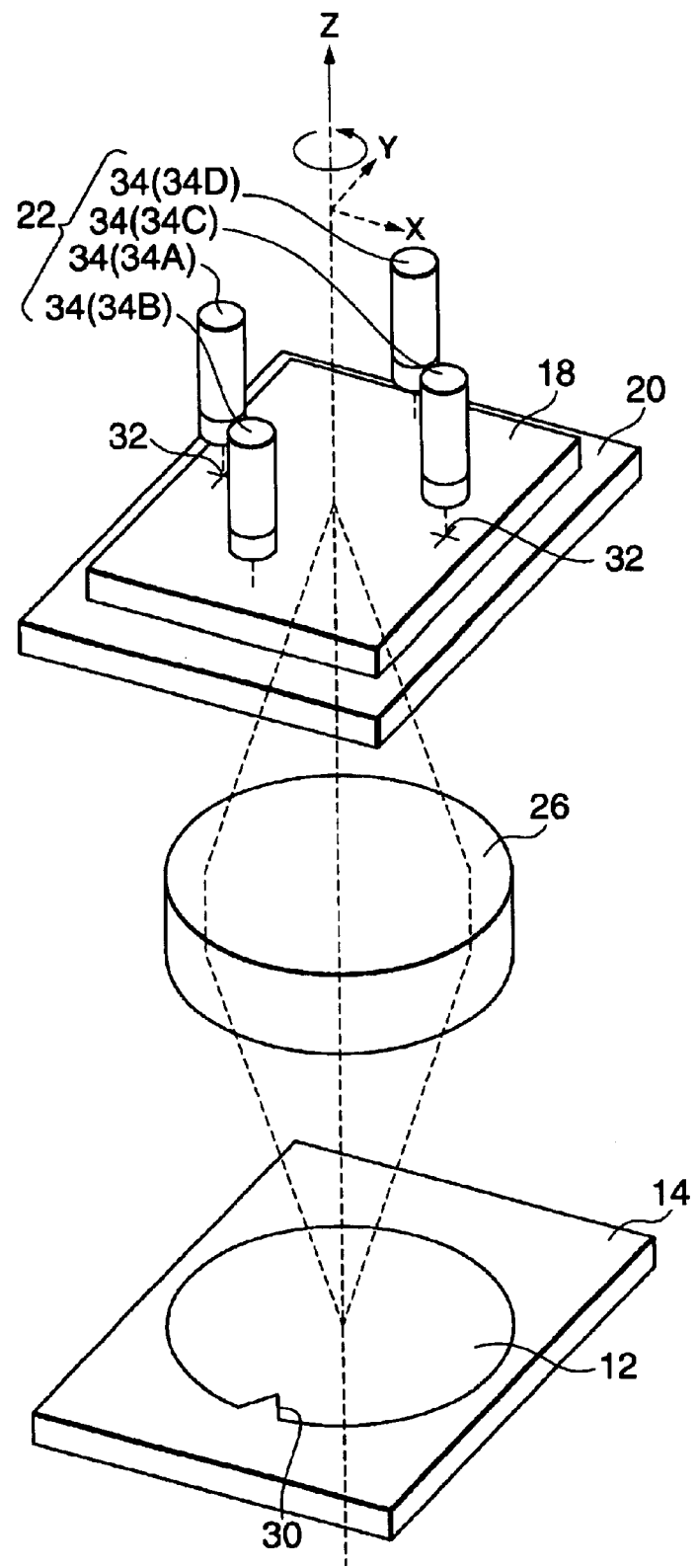
FIG. 2 is a perspective view showing a reticle position detector according to the first embodiment of the present invention and a detailed configuration of reticle, and the relationship of position between an image-forming optical system and a wafer.

As shown in FIG. 2 herein, the reticle 18 employed in the present embodiment is shaped in the form of a rectangle and has a surface formed with reticle alignment marks 32 at at least two points. The reticle alignment marks 32 correspond to predetermined marks according to the present invention.

The reticle position detector 22 comprises at least four reticle microscopes 34 for detecting the reticle alignment marks 32 from the surface of the reticle 18 when the reticle 18 is supported on the reticle stage 20. The reticle microscopes 34 are provided at positions corresponding to the respective reticle alignment marks 32 of the reticle 18 supported on a predetermined position by the reticle stage 20, and positions associated with positions where the reticle alignment marks 32 are rotated about the Z axis by predetermined angles, 90° as one example herein. Namely, the reticle position detector 22 is capable of grasping the rotations of the reticle 18 in units of 90° according to the result of detection of the reticle alignment marks 32 by the reticle microscopes 34. Namely, the reticle position detector 22 corresponds to detecting means of the present invention, and the respective reticle microscopes 34 respectively correspond to detecting elements of the present invention.

Incidentally, the number of the reticle microscopes 34 and their layout positions are determined according to the layouts of the reticle alignment marks 32 on the reticle 18. Described specifically, the present embodiment makes use of the reticle 18 formed with the reticle alignment marks 32 at two points symmetrical about a conventionally normally-used optical axis. Thus, when the reticle alignment marks 32 are rotated about the Z axis by 90°, they overlap each other at the same positions under the rotation of 180°. Therefore, even if the respective reticle alignment marks 32 are rotated about the Z axis by 90° by the four reticle microscopes 34A, 34B, 34C and 34D, the reticle microscopes are capable of coping with the reticle alignment marks. The reticle microscopes 34A, 34B, 34C and 34D are placed so as to correspond to positions when they are rotated about the Z axis 90° by 90°.

Incidentally, the reason why 90° is selected as one example, is that when the shape (rectangle) of the reticle, and the numbers and layouts of the reticle microscopes and reticle alignment marks are taken into consideration, the axis lines orthogonal to each other when the reticle alignment marks are rotated, take forms preferable for convenience of design.

The result of detection by the reticle position detector 22 is inputted to the stage controller 28 via the A/D converter (not shown) and used for control of the position adjusters 20A and 14A by the stage controller 28.

The stage controller 28 receives therein the result of detection by the reticle position detector 22 and controls the position adjuster 20A of the reticle stage 20 based on the result of detection.

Described specifically, when the reticle stage 20 is supporting the reticle 18 conveyed onto the reticle stage 20, the stage controller 28 controls the position adjuster 20A of the reticle stage 20 while monitoring the results of detection by any two of the reticle microscopes 34 in the reticle position detector 22 in such a manner that the corresponding reticle alignment marks 32 on the surface of the reticle 18 are detected by the corresponding reticle microscopes 34.

Namely, in the present embodiment, the stage controller 28 is capable of grasping the rotations of the reticle about the Z axis in units of 90 degrees by performing switching between the reticle microscopes 34 used to monitor the results of detection. When the position adjuster 20A of the reticle stage 20 is controlled to rotate the reticle 18 about the Z axis in 90° units, the stage controller 28 also performs control on the position adjuster 14A of the wafer stage 14 in such a way that the wafer 12 is also rotated in sync with the rotation of the reticle 18. Namely, the stage controller 28 bears a function as rotating means of the present invention.

A general light source such as a KrF excimer laser, which has heretofore been used in an exposure apparatus, can be used for the light source 24. Also the image-forming optical system 26 makes use of a general image-forming optical system such as a scale-down lens for reducing each circuit pattern formed on the reticle 18 to form an image, which has heretofore been used in the exposure apparatus.

One example of stage control performed by the stage controller 28 will next be explained as the operation of the present embodiment. Now consider below where when the wafer 12 is conveyed to the wafer stage 14, the stage controller 28 controls the position adjuster 14A of the wafer stage 14 based on the result of detection by the wafer position detector 16 to thereby align the wafer 12 to a predetermined position precisely.

When the reticle 18 is conveyed to the reticle stage 20, the stage controller 28 first sets reticle alignment to a predetermined position by use of the pre-specified predetermined two reticle microscopes 34, e.g., reticle microscopes 34A and 34C of the reticle position detector 22.

Described specifically, the stage controller 28 controls the position adjuster 20A of the reticle stage 20 while monitoring the results of detection by the reticle microscopes 34A and 34C and moves the reticle support surface at a predetermined speed along the X and Y axes or rotates it about the Z axis at a predetermined angular velocity until the corresponding reticle alignment marks 32 are respectively detected by the reticle microscopes 34A and 34C. Further, when the reticle microscopes 34A and 34C detect the corresponding reticle alignment marks 32, the stage controller 28 holds their states. Thus, the reticle 18 can be set to a predetermined position, and the wafer 12 and the reticle 18 are brought into alignment when the exposure apparatus 10 is taken as a whole.

Subsequently, the stage controller 28 performs rotational control for rotating the post-alignment wafer 12 and reticle 18 about the Z axis, based on the setting of rotation by a user interface (not shown). Incidentally, when the setting of rotation is held OFF, the light source 24 is lighted in the post-alignment state and each integrated circuit pattern formed on the reticle 18 may be exposed (transferred) onto the surface of the wafer 12.

Under the rotational control, the stage controller 28 performs selective switching between the reticle microscopes 34, specifically selects the reticle microscopes 34B and 34D. Further, the stage controller 28 controls the position adjuster 20A of the reticle stage 20 while monitoring the results of detection by the reticle microscopes 34B and 34D and thereby rotates the reticle support surface about the Z axis in the predetermined direction until the corresponding reticle alignment marks 32 are detected by the reticle microscopes 34B and 34D.

Simultaneously with the above, the stage controller 28 controls the position adjuster 14A of the wafer stage 14 to thereby rotate the wafer support surface about the Z axis in the predetermined direction in sync or registration with the rotation of the reticle support surface about the Z axis. Namely, since the reticle support surface and the wafer support surface are rotated about the Z axis at the same rotational angle, the reticle 18 on the reticle stage 20 and the wafer 12 on the wafer stage 14 are rotated in registration with each other in the Z-axis direction while the aligned state is being held.

When the corresponding reticle alignment marks 32 are respectively detected by the reticle microscopes 34B and 34D, the stage controller 28 stops the rotation of the reticle support surface and the wafer support surface and holds their states therein. Thus, the reticle 18 and the wafer 12 are supported in a state of being rotated 90° about the Z axis in the predetermined direction in a state in which they are brought into alignment.

The stage controller 28 performs selective switching between the reticle microscopes 34A and 34C and the reticle microscopes 34B and 34D and repeatedly carries out rotational control similar to the above, thereby making it possible to synchronously rotate the reticle 18 and the wafer 12 about the Z axis in a predetermined direction in 90° units while holding the aligned state of the reticle 18 and the wafer 12. After the stage controller 28 has performed their rotational control in 90° units by the specified number of times, the light source 24 is lighted and the integrated circuit pattern formed on the reticle 18 may be exposed (transferred) onto the surface of the wafer 12.

Thus, the first embodiment is configured such that the reticle 18 formed with the reticle alignment marks 32 at at least two points is used, the reticle microscopes 34 are placed in association with the respective positions of the reticle alignment marks 32 at the time that the reticle 18 is rotated about the Z axis by 90° in the state in which it is supported by the reticle stage 20, and the reticle alignment marks 32 are detected by any of the reticle microscopes 34 even if the reticle 18 being supported by the reticle stage 20 is rotated about the Z axis to thereby make it possible to grasp the rotational angles of the reticle in 90° units. The stage controller 28 is capable of controlling the rotation of the reticle 18 on the reticle stage 20 and the wafer 12 on the wafer stage 14 in 90° units by use of the result of detection when the reticle 18 and the wafer 12 are rotated about the Z axis while they are registered with each other.

Thus, after the reticle 18 and the wafer 12 have been brought into alignment, the exposure apparatus 10 is capable of synchronously rotating the reticle 18 and the wafer 12 about the Z axis in 90° units while holding their aligned state. In other words, the reticle 18 and wafer 12, and the image-forming optical system 26 are relatively rotated about the optical axis of the image-forming optical system 26 in 90° units, whereby the forms of distortion that appear on each transferred image on the wafer 12, can also be rotated in 90° units. Thus, when the forms of the distortion are rotated by at least one exposure apparatus in this way where a plurality of exposure apparatuses are utilized in combination, the forms of the respective distortion can be relatively rotated in 90° units, whereby displacements in position between the transferred images due to the difference in distortion between the exposure apparatuses can be reduced.

Figure 3A:
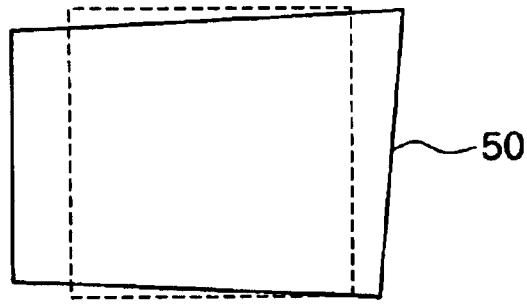
FIG. 3(A) shows a transferred image formed by an exposure apparatus, FIGS. 3(B) and 3(C) respectively show transferred images prior to and subsequent to their rotations, which are produced by an exposure apparatus different from that shown in FIG. 3(A)
Figure 3B:
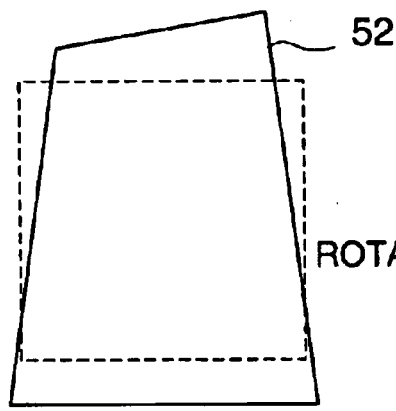
Figure 3C:
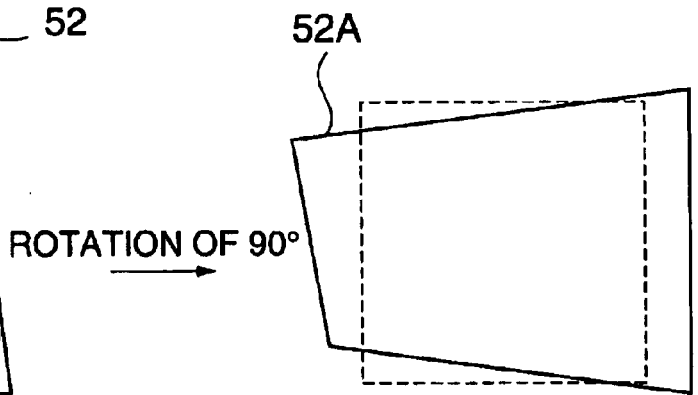

When exposure to light is performed by an exposure apparatus for forming a transferred image 52 having such a shape as shown in FIG. 3(B) after light exposure has been performed by an exposure apparatus for forming a transferred image 50 having such a shape as shown in FIG. 3(A) by way of example, the reticle 18 and the wafer 12 are rotated 90° about the Z axis, so that the form of each distortion included in the transferred image 52 of FIG. 3(B) is rotated 90° as shown in FIG. 3(C) to thereby obtain a transferred image 52A. Incidentally, each dotted line in FIG. 3 indicates an ideal transferred image.

Figure 3D:
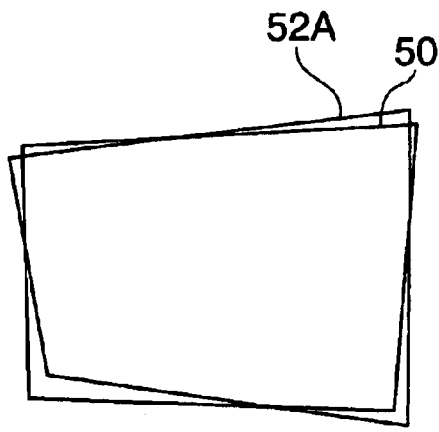
FIG. 3(D) shows transferred images obtained when two exposure apparatuses are utilized in combination.
Figure 7A:
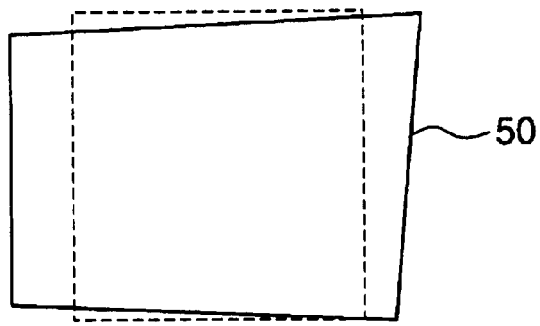
FIG. 7 is a transfer image conceptual diagram, wherein FIGS. 7(A) and 7(B) respectively show transferred images formed by different exposure apparatuses.
FIG. 7(C) shows transferred images obtained when the two exposure apparatuses are utilized in combination.
Figure 7B:
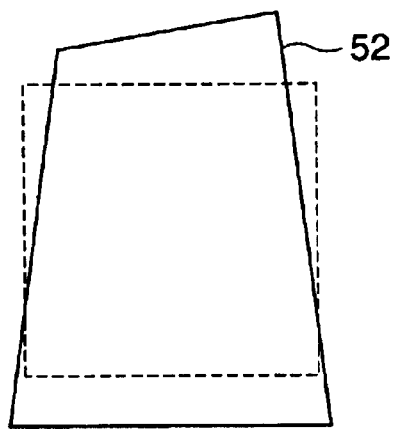
Figure 7C:
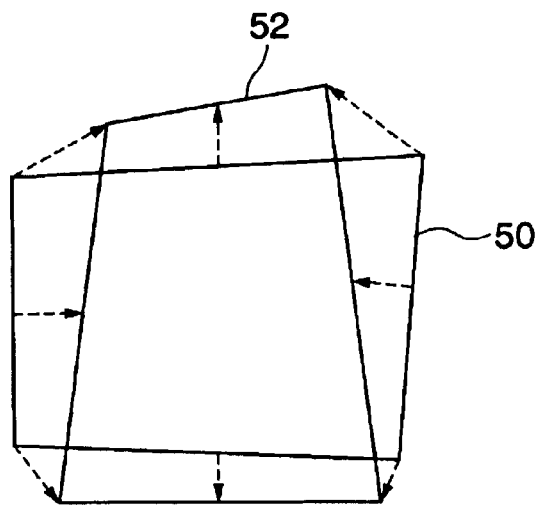

Thus, when the reticle 18 and the wafer 12 are exposed as they are without their rotation, displacements in position due to such distortion as shown in FIG. 7(C) occur between transferred images. However, when the forms of the distortion are rotated 90° as shown in FIG. 3(C), displacements in position between transferred images due to distortion can be reduced as shown in FIG. 3(D) as compared with FIG. 7(C).

Incidentally, the stage control performed by the stage controller 28 has been illustrated as one example. However, the present invention is not limited to it. While the above description has been made of, as one example, the case in which the rotational control for switching the choice of the reticle microscopes 34 to thereby synchronously rotate the reticle 18 and the wafer 12 by 90° is repeatedly performed, for example. The present invention is not limited to it. The reticle microscopes 34 corresponding to the positions of the reticle alignment marks 32 at the time that the reticle 18 is rotated about the Z axis by pre-specified rotational angles (90°, 180° and 270°) set in 90° units are selected, and the support surfaces of the reticle stage 20 and the wafer stage 14 are brought into registration with each other and rotated about the Z axis while monitoring the results of detection by the selected reticle microscope 34, whereby the reticle 18 and the wafer 12 can also be synchronously rotated by the specified rotational angles.

While the above description has been made of, as an example, the case in which after the reticle is set to the predetermined position and the reticle and wafer are brought into alignment, they are rotated in sync or registration with each other, the reticle and wafer are first synchronously rotated and thereafter the reticle alignment marks may be detected by the reticle microscopes 34 to set the reticle 18 to a predetermined position.

<Second Embodiment>

A second embodiment will next be explained. Incidentally, the same members as those employed in the first embodiment are respectively identified by the same reference numerals in the second embodiment and the description thereof will therefore be omitted.

Figure 4:
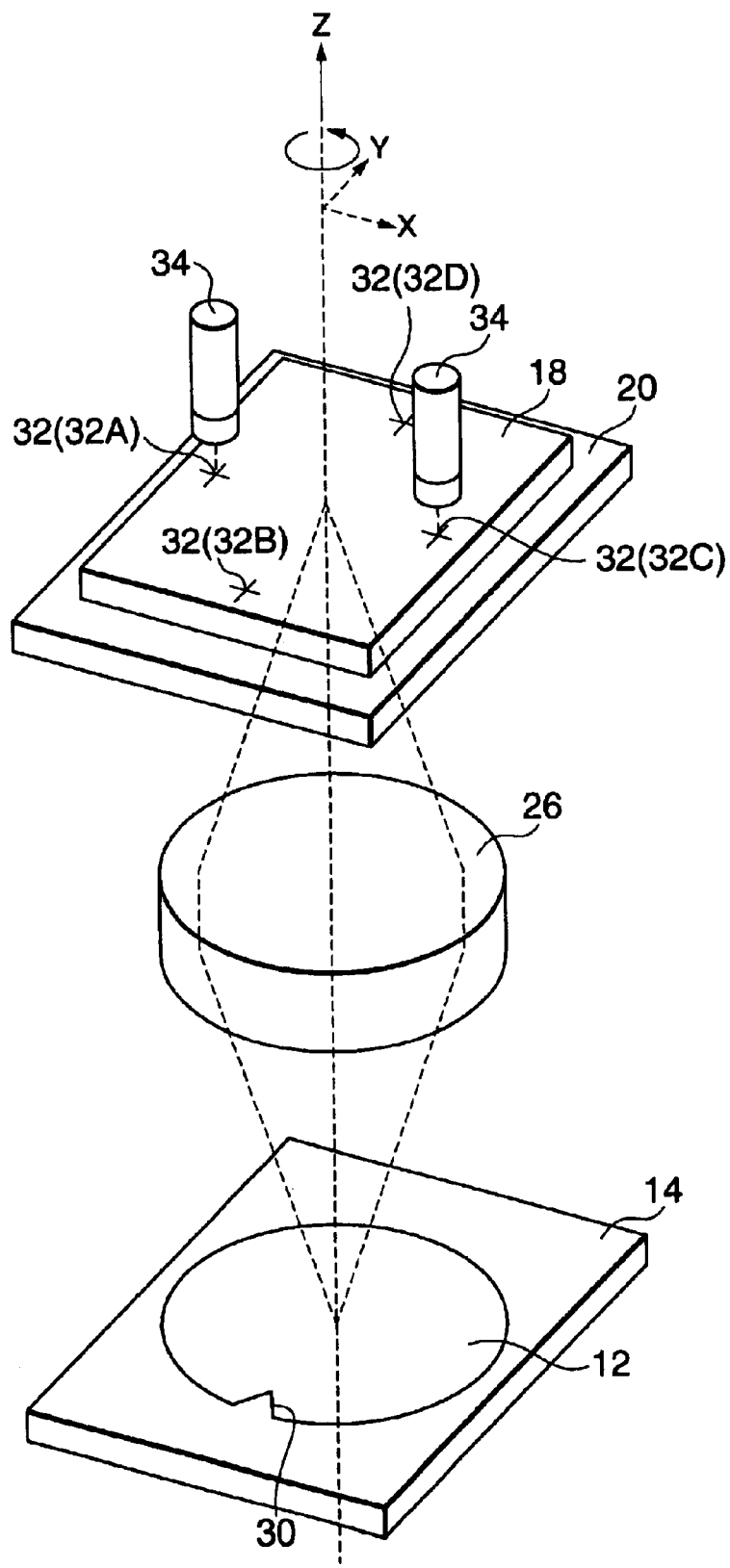
FIG. 4 is a perspective view showing a reticle position detector according to a second embodiment of the present invention and a detailed configuration of reticle, and the relationship of position between an image-forming optical system and a wafer.

In the second embodiment as shown in FIG. 4, a reticle position detector 22 comprises at least two reticle microscopes 34. A reticle 18 is formed with reticle alignment marks 32 at respective positions where positions corresponding to the reticle microscopes 34 are rotated about a Z axis by predetermined angles, 90° as one example herein.

Incidentally, FIG. 4 shows a case in which the reticle microscopes 34 are respectively provided in association with two positions symmetrical about the Z axis (the number of reticle microscopes 34: two). When, in this case, the positions corresponding to the reticle microscopes 34 on the reticle 18 are respectively rotated about the Z axis by 90°, the positions relative to each other overlap each other under the rotation of 180°. Therefore, the reticle 18 may be formed with four reticle alignment marks 32A, 32B, 32C and 32D at positions where they are rotated about the Z axis by 90°. Namely, the reticle alignment marks 32 are provided at four points: two points symmetrical about the optical axis, and two points corresponding to positions where the two points are respectively rotated 90°.

Incidentally, the reason why 90° is selected as one example, is that when the shape (rectangle) of the reticle, and the numbers and layouts of the reticle microscopes and reticle alignment marks are taken into consideration, the axis lines orthogonal to each other when the reticle alignment marks are rotated, take forms preferable for convenience of design.

Owing to such a configuration, in the second embodiment, the position of the reticle 18 can be detected according to the detection of any reticle alignment mark 32 by the corresponding reticle microscope 34 even if the reticle 18 is rotated about the Z axis in 90° units by a reticle stage 20. Thus, for example, the choice of the reticle alignment marks detected by the respective reticle microscopes 34 is switched after the reticle 18 and the wafer 12 have been brought into registration, whereby the reticle 18 and the wafer 12 can be synchronously rotated about the Z axis in 90° units while the aligned state is being held in a manner similar to the first embodiment.

Described specifically, the stage controller 28 controls driving of a position adjuster 20A of the reticle stage 20 while monitoring the results of detection of the reticle alignment marks 32A and 32C by the two reticle microscopes 34, thereby setting the reticle 18 to a predetermined position to align the reticle 18 and the wafer 12 with each other.

Next, if the stage controller 28 synchronously rotates the reticle 18 and the wafer 12 while monitoring the results of detection of the reticle alignment marks 32B and 32D by the corresponding reticle microscopes 34 until the reticle alignment marks 32B and 32D are detected, then the stage controller 28 is capable of rotating the reticle 18 and the wafer 12 about the Z axis at 90° while holding their aligned state. Similarly, if the stage controller 28 synchronously rotates the reticle 18 and the wafer 12 while objects to be monitored by the reticle microscopes are being switched between the reticle alignment marks 32A and 32C and the reticle alignment marks 32B and 32D, then the stage controller 28 can rotate the reticle 18 and the wafer 12 about the Z axis in 90° units while holding their registered state.

Thus, in a manner similar to the first embodiment even in the case of the second embodiment, when a plurality of exposure apparatuses are utilized in combination, the forms of respective distortion can be relatively rotated in 90° units such that the difference in distortion between the exposure apparatuses reaches the smallest. While the first embodiment needs at least four reticle microscopes 34, the second embodiment may be provided with at least two reticle microscopes. Thus, the present invention can be realized by the reticle microscopes 34 fewer than the first embodiment.

When the number of the reticle microscopes 34 is two as shown in FIG. 4 and their layouts are set to the sides opposite to each other, of the reticle 18, the present invention can be realized simply by using a general exposure apparatus and changing a program for defining control by the stage controller 28. Namely, since a hardware configuration remains used in the conventional exposure apparatus and only software-based countermeasures may be taken, the present invention can be realized at low cost.

Incidentally, the first and second embodiments respectively have described, as one example, the case in which the rotation of the reticle 18 is detected in predetermined units such as 90° and the reticle 18 is rotated by predetermined angles. However, the present invention is not limited to it. For instance, a rotary encoder is used to detect the angle of rotation of a reticle if it exercises an influence on an optical system of an exposure apparatus, whereby the rotation of the reticle may be detected at arbitrary angles. Since, in this case, synchronous rotation can be controlled at arbitrary angles, each displacement in position between transferred images can be minimized.

While the first and second embodiments respectively have described, as one example, the case in which the reticle 18 and the wafer 12 are rotated about the optical axis (Z axis) of the image-forming optical system 26, the present invention is not limited to it. The essence of the invention is that the reticle 18 and wafer 12 and the image-forming optical system 26 are relatively rotated and moved about the optical axis (Z axis) to thereby rotate the forms of distortion. The image-forming optical system 26 may be rotated about the optical axis (Z axis) without rotating the reticle 18 and the wafer 12. Alternatively, both the reticle 18 and wafer 12 and the image-forming optical system 26 may be rotated.

Figure 5:
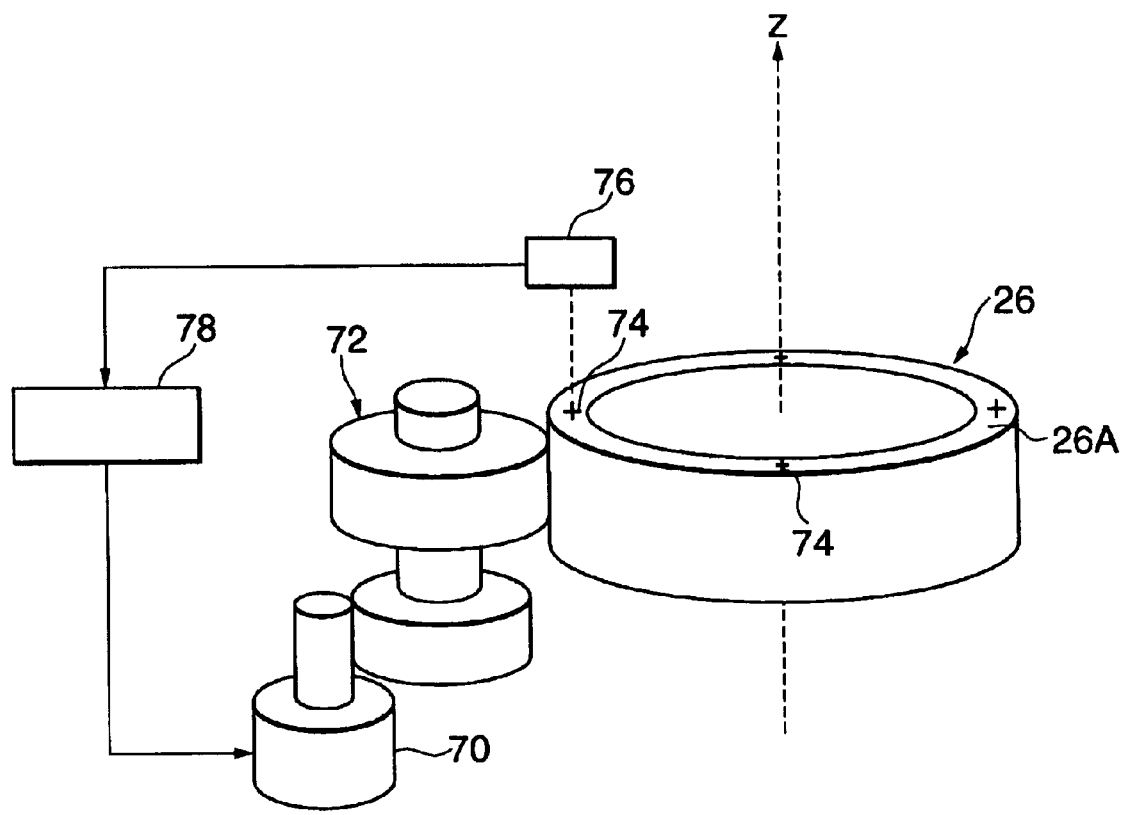
FIG. 5 is a perspective view illustrating a configuration for rotating an image-forming optical system according to another embodiment of the present invention.
Figure 6:
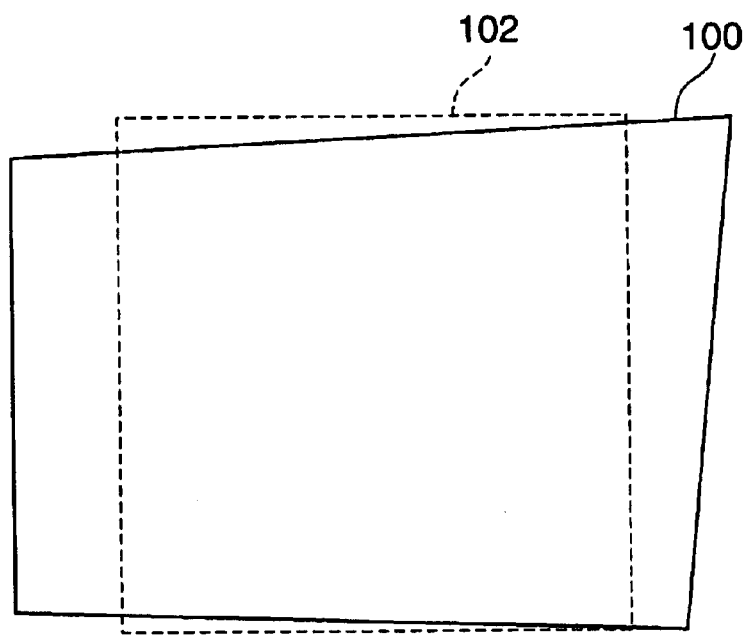
FIG. 6 is a conceptual diagram for describing distortion.

In order to rotate an image-forming optical system 26, there are provided, as shown in FIG. 5 by way of example, a member 72 which is activated for a support member 26A supporting various optical members constituting the image-forming optical system 26 and rotates the image-forming optical system 26 for each support member under the driving of a motor 70, and a detector 76 for detecting alignment marks 74 formed on the support member 26A every predetermined angles about a Z axis to thereby detect rotational angles of the image-forming optical system 26. If the driving of the motor 7$u$0 is controlled by a controller 78 based on the result of detection by the detector 76, then the image-forming optical system 26 can be rotatably controlled about its optical axis. Incidentally, the rotary encoder may be used to detect each rotational angle of the image-forming optical system 26 in a manner similar to the case where each rotational angle of the reticle is detected.

However, the image-forming optical system 26 is very delicate. Further, there is the fear that a problem will arise in that, for example, when the image-forming optical system 26 is rotated, the optical axis between the various optical members constituting the image-forming optical system 26 is shifted. It is therefore hard to control the image-forming optical system 26. The reticle 18 and the wafer 12 may preferably be rotated as described above.

While the above description has been made of, as one example, the case in which the stage controller is used as the rotating means to thereby relatively rotate the reticle and wafer and the image-forming optical system about the optical axis, the present invention is not limited to it. The reticle and wafer and the image-forming optical system may be rotated relatively about the optical axis. Alternatively, they may be rotated manually.

As described above, the present invention has an excellent advantageous effect in that a displacement in position between an under pattern and a resist pattern due to distortion can be reduced.

Further aspect of the present invention includes an exposure method comprising the steps of, when each of a plurality of exposure apparatuses applies exposure light to a reticle formed with a plurality of circuit patterns, and focuses light transmitted through or reflected by the reticle onto the surface of a wafer by an image-forming optical system as images to thereby transfer the circuit patterns thereto, and the plurality of exposure apparatuses laminate and transfer the plurality of circuit patterns onto the same wafer surface, relatively rotating the reticle and the wafer, and the image-forming optical system about an optical axis of the image-forming optical system by at least one exposure apparatus according to displacements in position between transferred images on the wafer surface due to the differences in distortion developed through the image-forming optical systems among the plurality of exposure apparatuses.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. An exposure apparatus comprising:
    reticle support means for supporting a reticle on a predetermined position;
    wafer support means for supporting a wafer on a predetermined position;
    a light source for applying exposure light to the reticle; and
    an image-forming optical system for focusing the light of reflected by or transmitted through the reticle, of the exposure light irradiated from said light source onto the surface of the wafer supported by said wafer support means to thereby form each image thereon;
    wherein the reticle supported by said reticle support means and the wafer supported by said wafer support means, and said image-forming optical system are rotatably provided relatively about an optical axis of said image-forming optical system.

2. The exposure apparatus according to claim 1, further including means for detecting the angles of said rotations and means for relatively rotating the reticle and the wafer, and the image-forming optical system about the optical axis, wherein said rotating means rotates the reticle and the wafer, and the image-forming optical system by predetermined angles, based on the results of detection by said detecting means.

3. The exposure apparatus according to claim 2, wherein the reticle is formed with predetermined marks at at least two points,
    said detecting means detect positions of the marks formed on the reticle and positions rotated predetermined angles from the positions of the marks, and
    said rotating means rotates the reticle and the wafer about the optical axis by the predetermined angles, based on the results of detection of the marks by said detecting means.

4. The exposure apparatus according to claim 3, wherein said detecting means are provided in association with the positions of the marks and the positions rotated about the optical axis at the predetermined angles from the positions of the marks respectively and include detecting elements for detecting the marks.

5. The exposure apparatus according to claim 2, wherein the reticle is formed with predetermined marks at at least two points and respective positions where the two points are rotated predetermined angles about the optical axis,
    said detecting means detect the positions of the marks formed at said least two points of the reticle, and
    said rotating means rotates the reticle and the wafer about the optical axis by predetermined angles, based on the results of detection of the marks by said detecting means.

6. The exposure apparatus according to claim 5, wherein said detecting means are respectively provided so as to correspond to the positions of the marks formed at said at least two points and include detecting elements for detecting the marks.

* * * * *